US008339297B2

(12) United States Patent (10) Patent No.: US 8,339,297 B2
Lindemann et al. (45) Date of Patent: Dec. 25, 2012

(54) DELTA-SIGMA MODULATOR AND DITHERING METHOD INCLUDING A DITHERING CAPABILITY FOR ELIMINATING IDLE TONES

(75) Inventors: Stig Lindemann, Aarhus N (DK); Mads Kolding Nielsen, Hovedgaard (DK)

(73) Assignee: Micro Motion, Inc., Boulder, CO (US)

( * ) Notice: Subject to any disclaimer, the term of this patent is extended or adjusted under 35 U.S.C. 154(b) by 153 days.

(21) Appl. No.: 13/054,826

(22) PCT Filed: Jul. 30, 2008

(86) PCT No.: PCT/US2008/071595
§ 371 (c)(1),
(2), (4) Date: Jan. 19, 2011

(87) PCT Pub. No.: WO2010/014086
PCT Pub. Date: Feb. 4, 2010

(65) Prior Publication Data
US 2011/0128173 A1 Jun. 2, 2011

(51) Int. Cl.
*H03M 1/20* (2006.01)
(52) U.S. Cl. ........................................ 341/131; 341/143
(58) Field of Classification Search .................. 341/144, 341/143, 118, 120, 131
See application file for complete search history.

(56) References Cited

U.S. PATENT DOCUMENTS

| | | | |
|---|---|---|---|
| 7,215,267 B1 * | 5/2007 | Johnston | 341/131 |
| 7,345,607 B1 | 3/2008 | Frigaard et al. | |
| 7,382,300 B1 * | 6/2008 | Nanda et al. | 341/143 |
| 8,248,127 B2 * | 8/2012 | Chan et al. | 327/172 |
| 2006/0279589 A1 * | 12/2006 | Yasutomi et al. | 347/6 |

FOREIGN PATENT DOCUMENTS

| | | |
|---|---|---|
| JP | 6061863 A | 3/1994 |
| JP | 6104751 A | 4/1994 |
| WO | 2007040989 A1 | 4/2007 |
| WO | 2008036140 A | 3/2008 |

OTHER PUBLICATIONS

Magrath A J et al: "Digital-Domain Dithering of Sigma-Delta Modulators Using Bit Flipping" Journal of the Audio Engineering Society, Audio Engineeering Society, New York, NY, US, vol. 45, No. 6, Jun. 1, 1997, pp. 467-475, XP000695382.

* cited by examiner

*Primary Examiner* — Peguy Jean Pierre
(74) *Attorney, Agent, or Firm* — The Ollila Law Group LLC

(57) ABSTRACT

A delta-sigma modulator (100) including a dithering capability for eliminating idle tones is provided according to the invention. The delta-sigma modulator (100) includes a bitstream converter (107) configured to generate a digital signal output substantially corresponding to an analog signal input, a periodicity detector (111) coupled to the bitstream converter (107) and configured to detect periodicity in the digital signal output, and a dithering sequence generator (116) connected to and activated by the periodicity detector (111). The dithering sequence generator (116) generates a dithering sequence. The delta-sigma modulator (100) further includes a pulse-width modulation (PWM) generator (119) coupled to the dithering sequence generator (116) and receiving the dithering sequence. The PWM generator (119) modulates the dithering sequence onto the analog signal input of the delta-sigma modulator (100) as a dithering signal.

12 Claims, 4 Drawing Sheets

DELTA-SIGMA MODULATOR AND DITHERING METHOD INCLUDING A DITHERING CAPABILITY FOR ELIMINATING IDLE TONES

BACKGROUND OF THE INVENTION

1. Field of the Invention

The present invention relates to a delta-sigma modulator, and more particularly, to a delta-sigma modulator and dithering method including a dithering capability for eliminating idle tones.

2. Statement of the Problem

A delta-sigma modulator comprises an electronic device or circuit that digitizes an analog input and comprises a widely used analog-to-digital converter (ADC). FIG. 1 shows a delta-sigma modulator according to the prior art. The prior art delta-sigma modulator includes an integrator at the analog input and the output of the integrator is fed into a bitstream processor. The bitstream processor receives the analog input and generates a corresponding (serial) digital output bitstream. The output of the bitstream processor comprises the digital output of the delta-sigma modulator.

A common and known drawback of a prior art delta-sigma modulator is that the output typically includes unwanted noise. The prior art delta-sigma modulator as a consequence includes a dithering signal that is fed back into the input in order to at least somewhat randomize the analog input signal. The dithering signal can have a low amplitude so that the dithering is only effective at low input signal amplitudes or idle times.

One drawback of a prior art delta-sigma modulator is that erroneous outputs can be generated when the input is idle, including idle tones that are generated when the analog input contains direct current (DC) values or signals. During such periodicity, the output of the prior art delta-sigma modulator produces idle tones comprising noise spikes in the output. These noise spikes can be erroneously interpreted as digital values.

Another drawback in the prior art is that the dithering is always performed and is not activated as needed.

ASPECTS OF THE INVENTION

In one aspect of the invention, a delta-sigma modulator including a dithering capability for eliminating idle tones comprises:

a bitstream converter configured to generate a digital signal output substantially corresponding to an analog signal input;

a periodicity detector coupled to the bitstream converter and configured to detect periodicity in the digital signal output;

a dithering sequence generator connected to and activated by the periodicity detector when the periodicity is detected, wherein the dithering sequence generator generates a dithering sequence; and a pulse-width modulation (PWM) generator coupled to the dithering sequence generator and receiving the dithering sequence, wherein the PWM generator modulates the dithering sequence onto the analog signal input of the delta-sigma modulator as a dithering signal.

Preferably, the dithering sequence generator generates a substantially random dithering sequence.

Preferably, the delta-sigma modulator further comprises an integrator configured to input the analog signal input and the dithering signal into the bitstream converter.

Preferably, the periodicity detector compares a sampling window of the digital signal output to one or more predetermined patterns and the periodicity is detected if the sampling window matches at least one pattern of the one or more predetermined patterns.

Preferably, the periodicity detector masks one or more portions of the digital signal output with one or more predetermined masks to generate one or more masked portions and compares a remaining digital content of the one or more masked portions to a predetermined mask threshold, wherein the periodicity is detected if the remaining digital content exceeds the predetermined mask threshold.

Preferably, the periodicity detector filters one or more portions of the digital signal output to generate one or more filtered portions, processes the one or more filtered portions to determine the presence of harmonics, and compares the harmonics to a predetermined harmonics threshold, wherein the periodicity is detected if the harmonics exceed the predetermined harmonics threshold.

Preferably, the periodicity detector comb filters one or more portions of the digital signal output to generate one or more comb filtered portions, processes the one or more comb filtered portions to determine the presence of harmonics, and compares the harmonics to a predetermined harmonics threshold, wherein the periodicity is detected if the harmonics exceed the predetermined harmonics threshold.

In one aspect of the invention, a delta-sigma modulator dithering method including a dithering capability for eliminating idle tones comprises:

detecting periodicity in a digital signal output of the delta-sigma modulator;

activating a dithering signal directed onto an input of the delta-sigma modulator during periods when the periodicity is detected;

generating a substantially random sequence as a dithering sequence; and modulating the dithering sequence onto an input of the delta-sigma modulator as a pulse-width modulated (PWM) digital dithering signal, wherein the generating and modulating are activated during periods when the periodicity is detected.

Preferably, detecting the periodicity further comprises comparing a sampling window of the digital signal output to one or more predetermined patterns and the periodicity is detected if the sampling window matches at least one pattern of the one or more predetermined patterns.

Preferably, detecting the periodicity further comprises masking one or more portions of the digital signal output with one or more predetermined masks to generate one or more masked portions and comparing a remaining digital content of the one or more masked portions to a predetermined mask threshold, wherein the periodicity is detected if the remaining digital content exceeds the predetermined mask threshold.

Preferably, detecting the periodicity further comprises filtering one or more portions of the digital signal output to generate one or more filtered portions, processing the one or more filtered portions to determine the presence of harmonics, and comparing the harmonics to a predetermined harmonics threshold, wherein the periodicity is detected if the harmonics exceed the predetermined harmonics threshold.

Preferably, detecting the periodicity further comprises comb filtering one or more portions of the digital signal output to generate one or more comb filtered portions, processing the one or more comb filtered portions to determine the presence of harmonics, and comparing the harmonics to a predetermined harmonics threshold, wherein the periodicity is detected if the harmonics exceed the predetermined harmonics threshold.

DESCRIPTION OF THE DRAWINGS

The same reference number represents the same element on all drawings. It should be understood that the drawings are not necessarily to scale.

DETAILED DESCRIPTION OF THE INVENTION

Figure 1:
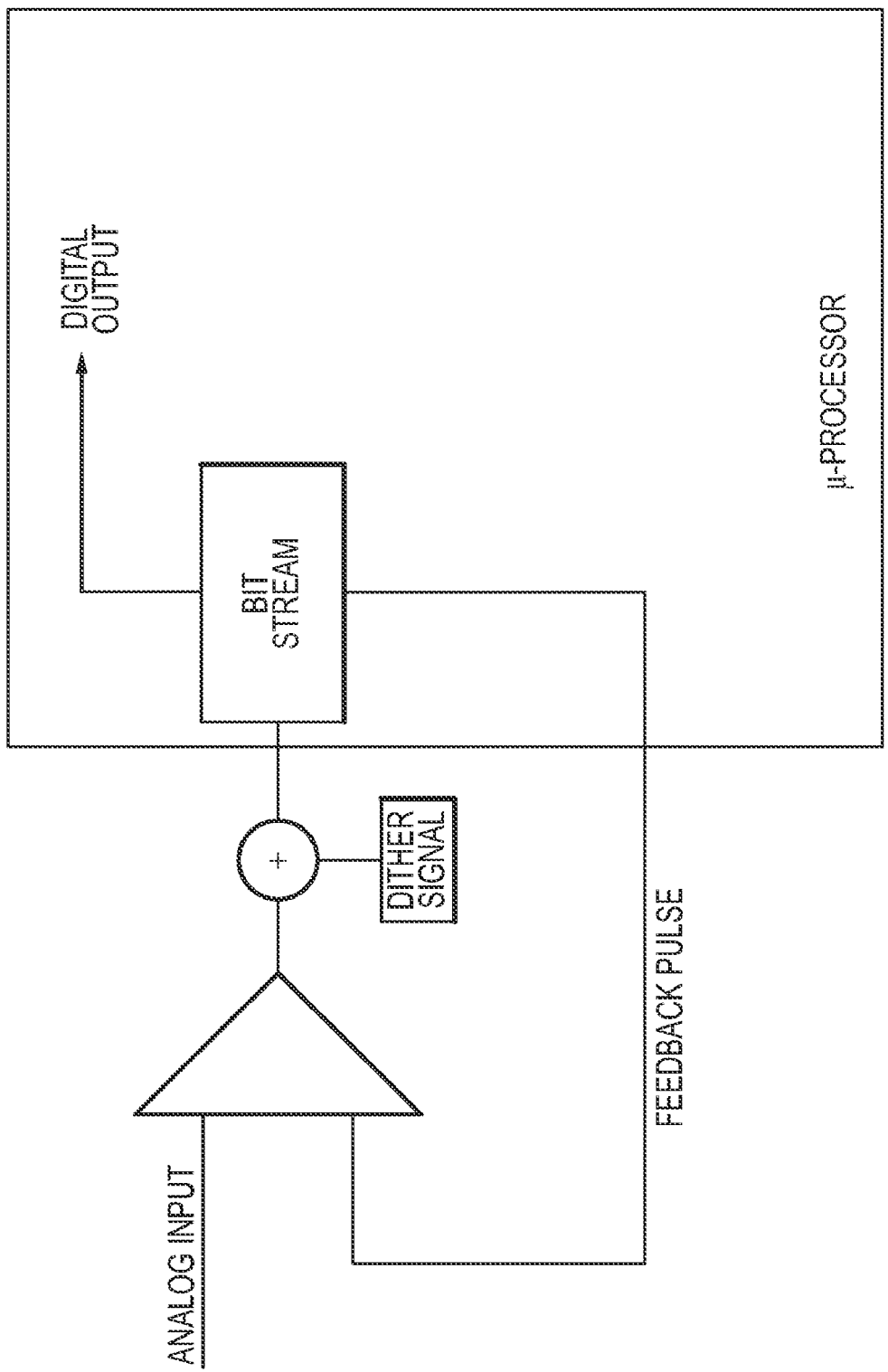
FIG. 1 shows a delta-sigma modulator according to the prior art.
Figure 2:
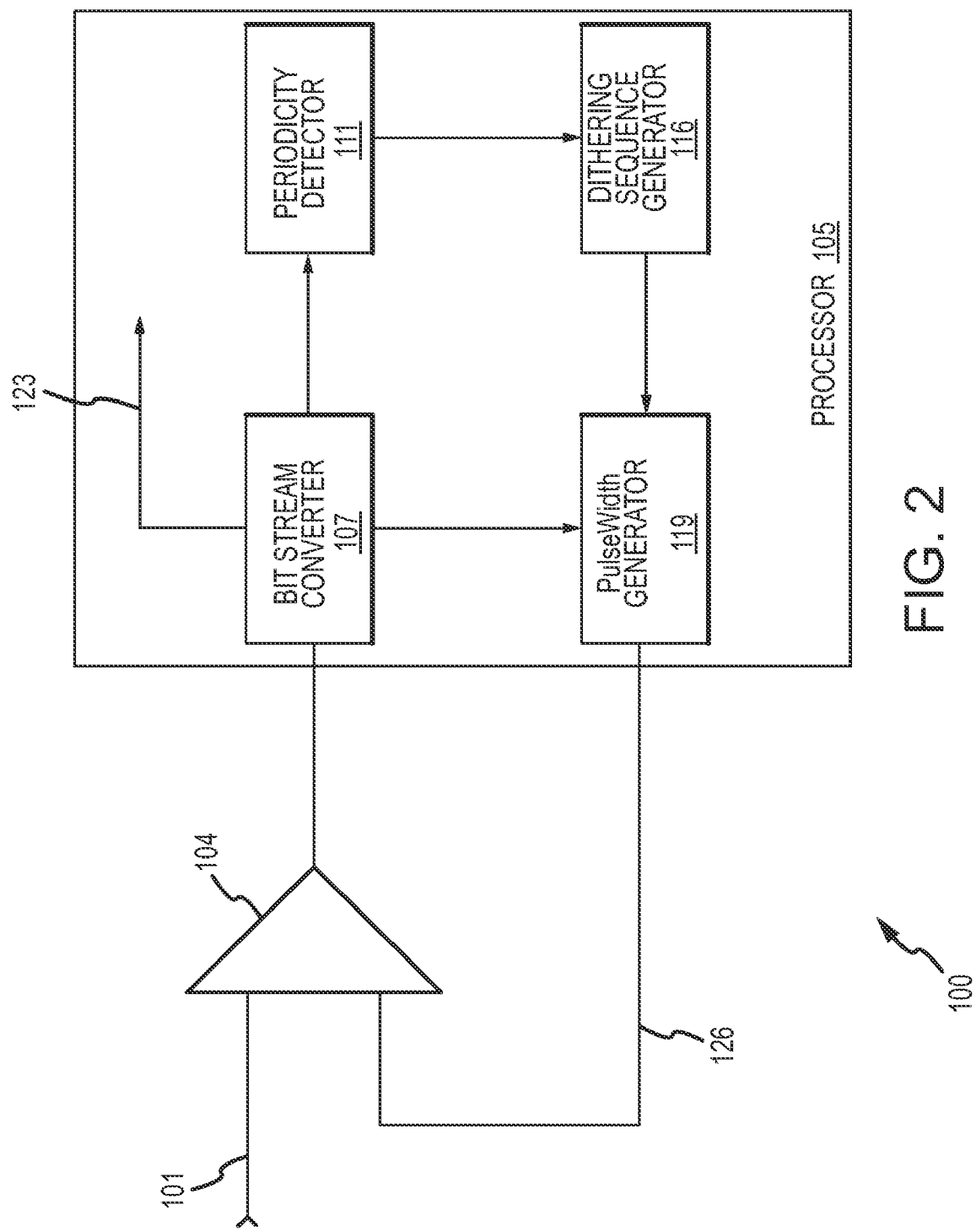
FIG. 2 shows a delta-sigma modulator according to an embodiment of the invention.
Figure 3:
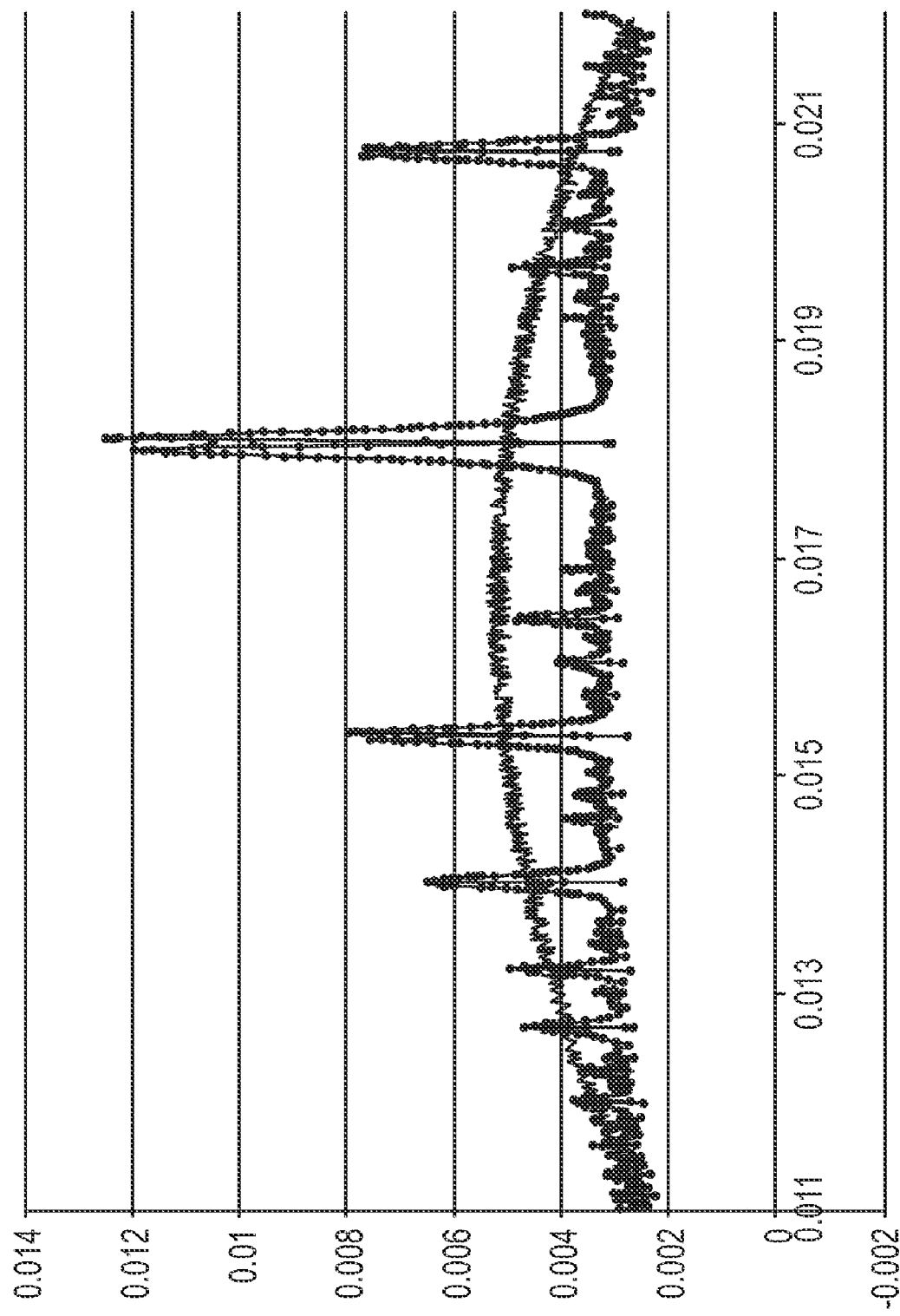
FIG. 3 is a graph of delta-sigma output both with and without the dithering according to the invention.
Figure 4:
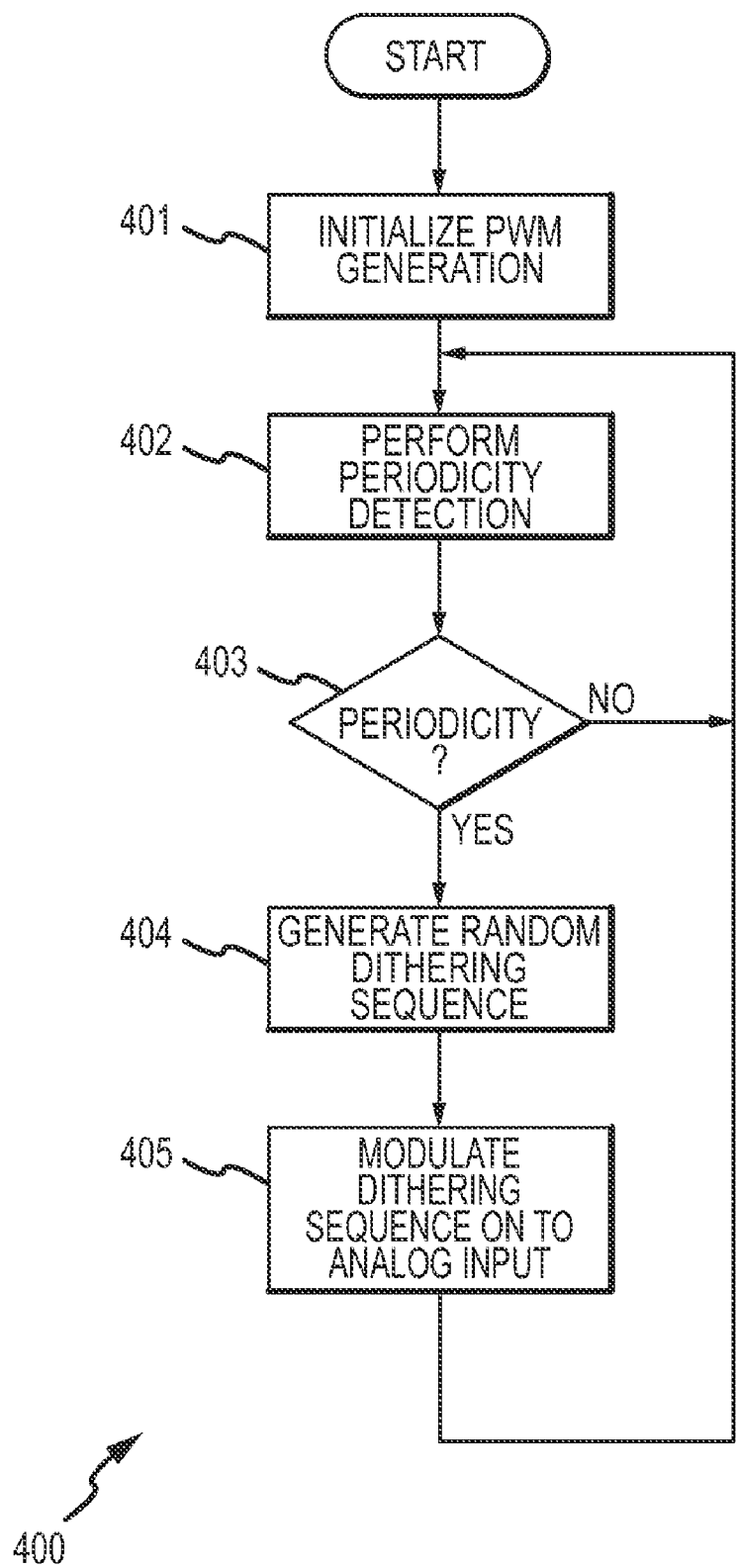
FIG. 4 is a flowchart of a delta-sigma modulator dithering method according to an embodiment of the invention.

FIGS. 2-4 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

FIG. 2 shows a delta-sigma modulator 100 according to an embodiment of the invention. The delta-sigma modulator 100 comprises an analog-to-digital converter (ADC) capable of converting an analog voltage signal into a corresponding serial digital representation.

The delta-sigma modulator 100 includes a processor 105 connected to an integrator 104. The integrator 104 includes an analog input 101 that receives an analog input signal for conversion to a digital signal output. In some embodiments, the integrator 104 can include multiple states (i.e., orders). For example, the integrator 104 can comprise two integrators where the delta-sigma modulator 100 comprises a second-order modulator. However, it should be understood that the delta-sigma modulator 100 can comprise a modulator of any order. The processor 105 further includes a digital output 123 that can be connected to any manner of other device and a feedback path 126 that is coupled to the integrator 104. The feedback path 128 feeds the digital signal output from the bitstream converter 107 back into the input of the bitstream converter 107.

The feedback path 126 also feeds a dithering signal back to the integrator 104 and the integrator 104 combines the dithering signal with the analog input signal. The dithering signal comprises an intentionally applied, substantially random signal that is used to randomize or minimize idle tones/periodicity present in the output of the A/D conversion.

The processor 105 can implement processes that perform the A/D conversion. The processes include a bitstream converter 107, a periodicity detector 111, a dithering sequence generator 116, and a pulse-width modulation (PWM) generator 119. The processor 105 can comprise a general purpose computer, a microprocessing system, a logic circuit or application specific integrated circuit, or some other general purpose or customized processing device. The processor 105 can include one or more processing devices. The processor 105 can include any manner of integral or independent electronic storage medium. However, it should be understood that the processor 105 can alternatively be replaced by or include discrete circuitry designed to perform the processes.

The bitstream converter 107 receives the analog input signal plus any superimposed dithering signal. The bitstream converter 107 performs the A/D conversion and generates a serial digital bitstream on the digital output 123. The serial digital bitstream comprises a digital representation of the analog signal at the analog input 101.

In addition, the bitstream converter 107 is coupled to the periodicity detector 111. The digital output of the bitstream converter 107 is used to detect periodicity. Moreover, the bitstream converter 107 is further coupled to the PWM generator 119.

The serial digital bitstream provides a gain factor that is used to control or set the PWM output from the PWM generator 119. The bitstream converter 107 can provide the gain factor to the PWM generator 119 without the need for any external gain-setting or gain-determining external elements (i.e., resistors and capacitors), as external elements could introduce temperature drift or other noise.

The periodicity detector 111 is coupled to the bitstream converter 107 and to the dithering sequence generator 116. The periodicity detector 111 is configured to detect periodicity in the digital bitstream output of the delta-sigma modulator 100. When the periodicity detector 111 detects periodicity in the digital bitstream output, the periodicity detector 111 can change its output value and can correspondingly activate and de-activate the dithering sequence generator 116. The ability of the periodicity detector 111 to activate and de-activate the dithering sequence generator 116 enables the periodicity detector 111 to activate and de-activate the dithering signal.

The periodicity detector 111 can detect periodicity in various ways. In one embodiment, the periodicity detector 111 employs a table lookup. The periodicity detector (111) compares a sampling window of the digital signal output to one or more predetermined patterns and the periodicity is detected if the sampling window matches at least one pattern of the one or more predetermined patterns. The window can be of a predetermined size designed to capture desired periodicity. The window is moved over time and repeated comparisons to the table are iteratively performed. In some embodiments, a single table match may be sufficient for detecting periodicity, but alternatively in other embodiments multiple matches may need to be found.

Further processing may need to be performed on found table entries. For example, some manner of averaging or integrating may be performed on matching table entries in order to ultimately determine periodicity.

In another embodiment, the periodicity detector 111 performs masking to detect periodicity. The periodicity detector (111) masks one or more portions of the digital signal output with one or more predetermined masks to generate one or more masked portions and compares a remaining digital content of the one or more masked portions to a predetermined mask threshold, wherein the periodicity is detected if the remaining digital content exceeds the predetermined mask threshold. Alternatively, the masking may be performed over a plurality of windows. The masking result (i.e., any remaining digital values) is averaged or summed in some manner, such as by taking the root-mean-square (RMS) value of the results and then the remaining digital content is compared to a predetermined mask threshold. If the remaining digital content exceeds the predetermined mask threshold, then the periodicity detector 111 determines that periodicity has been detected.

In yet another embodiment, the periodicity detector 111 filters the digital output signal in order to detect periodicity. The filtering can be directed towards detecting/quantifying harmonics, for example. The periodicity detector (111) filters one or more portions of the digital signal output to generate one or more filtered portions, processes the one or more filtered portions to determine the presence of harmonics, and compares the harmonics to a predetermined harmonics threshold, wherein the periodicity is detected if the harmonics exceed the predetermined harmonics threshold. In some embodiments, the filtering comprises a digital comb filter that features a plurality of notches that lie between anticipated harmonics of the sampling frequency of the delta-sigma modulator 100. The outputs of the comb filter can subsequently be processed to determine the presence of harmonics, such as by averaging, taking a RMS value, integrating, or otherwise quantifying the filter output.

It should be understood that the periodicity detector 111 is not limited to performing one of the above detection types. The periodicity detection can include one or more of the above detection schemes. For example, the periodicity detector 111 can perform filtering and then can perform a table lookup/pattern matching operation on the filtration results.

The dithering sequence generator 116 provides a dithering sequence to the PWM generator 119. The dithering sequence generator 116 is activated and de-activated by the periodicity detector 111. The dithering sequence can comprise a predetermined sequence. In some embodiments, the dithering sequence generator 116 generates a substantially random dithering sequence. Alternatively, the dithering sequence generator 116 can implement a predetermined pattern or patterns designed to have a low level of repetition.

The PWM generator 119 is coupled to and controlled by the dithering sequence generator 116. Use of a PWM dithering enables a higher dithering frequency. The PWM generator 119 receives the dithering sequence from the dithering sequence generator 116 and generates a PWM dithering signal therefrom. The pulse widths of the dithering signal on the feedback path 126 are therefore sufficiently random in energy content to break up or substantially prevent idle tones (or other quantization errors) at the digital output 123.

The PWM generator 119 in some embodiments can perform trimming, reducing a pulse width of the dithering/feedback signal provided to the analog input. As a result of the trimming, the pulses of the dithering/feedback signal are narrower than in the prior art. Advantageously, this gives the ADC gain. Further, the use of a PWM signal generates a chaotic pulse stream that does not have a dominant frequency and instead features a broad frequency spectrum. However, the dithering/feedback signal does not contain direct current (DC) values. The lack of a DC component in the dithering/feedback signal does not cause the accuracy of the digitized result to be affected.

FIG. 3 is a graph of delta-sigma output both with and without the dithering according to the invention. The lower curve comprises the output without the dithering according to the invention. The spikes in comprise idle tones that appear at the delta-sigma modulator output during idle periods. Properly, where the analog input should generate digital zero output values, the digital signal output now includes the spikes. The spikes can be erroneously interpreted as digital "one" values by subsequent circuitry. This noise can corrupt any further measurement or action performed on or by the digital signal output. If severe, the noise can be radiated and picked up by electronic components that are not even downstream of the delta-sigma modulator device.

The upper curve in the graph comprises output of a dithered delta-sigma modulator according to the invention. The upper curved line deviates from a flat line, which would be the ideal output of the delta-sigma modulator where the analog input to the delta-sigma modulator is substantially quiescent. However, the dithered delta-sigma modulator does not exhibit the voltage amplitude of the spikes and therefore is much less likely to be erroneously interpreted as a digital one value. The energy of the spikes has been spread out and rendered inoffensive FIG. 4 is a flowchart 400 of a delta-sigma modulator dithering method according to an embodiment of the invention. In step 401, a pulse-width modulation (PWM) signal is initialized, such as during power-up or initialization of a device that includes the delta-sigma modulator, for example. The initialization can include initializing a starting pulse width, initializing a pulse period, etc.

In step 402, periodicity detection is performed. The periodicity detection can include detection of idle tones during periods when DC values are present on the analog signal input. The generated bitstream digital output (and feedback) will often contain periodic portions when the analog input contains DC values. Idle tones are seen as noise spikes in the digital output.

The periodicity can be detected through use of a table lookup, masking, or filtering, as previously discussed. A sample window(s) can be captured and processed in the detection process.

In step 403, if periodicity is detected, then the method proceeds to step 404. Otherwise, the method branches back up to step 402 and continues to monitor for periodicity.

In step 404, where periodicity is detected in the digital output, then the dithering capability is activated. The activation can comprise generation of a random dithering sequence.

In step 405, the random dithering sequence is modulated onto a PWM feedback signal that is in turn modulated onto the analog input as the dithering signal. The substantially random nature of the dithering signal breaks up and/or prevents periodicity and idle tones in the digital output of the delta-sigma modulator.

What is claimed is:

1. A delta-sigma modulator (100) including a dithering capability for eliminating idle tones, the delta-sigma modulator (100) comprising;
    a bitstream converter (107) configured to generate a digital signal output substantially corresponding to an analog signal input;
    a periodicity detector (111) coupled to the bitstream converter (107) and configured to detect periodicity in the digital signal output;
    a dithering sequence generator (116) connected to and activated by the periodicity detector (111) when the periodicity is detected, wherein the dithering sequence generator (116) generates a dithering sequence; and
    a pulse-width modulation (PWM) generator (119) coupled to the dithering sequence generator (116) and receiving the dithering sequence, wherein the PWM generator (119) modulates the dithering sequence onto the analog signal input of the delta-sigma modulator (100) as a dithering signal.

2. The delta-sigma modulator (100) of claim 1, with the dithering sequence generator (116) generating a substantially random dithering sequence.

3. The delta-sigma modulator (100) of claim 1, further comprising an integrator (104) configured to input the analog signal input and the dithering signal into the bitstream converter (107).

4. The delta-sigma modulator (100) of claim 1, wherein the periodicity detector (111) compares a sampling window of the digital signal output to one or more predetermined patterns and the periodicity is detected if the sampling window matches at least one pattern of the one or more predetermined patterns.

5. The delta-sigma modulator (100) of claim 1, wherein the periodicity detector (111) masks one or more portions of the digital signal output with one or more predetermined masks to generate one or more masked portions and compares a remaining digital content of the one or more masked portions to a predetermined mask threshold, wherein the periodicity is detected if the remaining digital content exceeds the predetermined mask threshold.

6. The delta-sigma modulator (100) of claim 1, wherein the periodicity detector (111) filters one or more portions of the digital signal output to generate one or more filtered portions, processes the one or more filtered portions to determine the presence of harmonics, and compares the harmonics to a predetermined harmonics threshold, wherein the periodicity is detected if the harmonics exceed the predetermined harmonics threshold.

7. The delta-sigma modulator (100) of claim 1, wherein the periodicity detector (111) comb filters one or more portions of the digital signal output to generate one or more comb filtered portions, processes the one or more comb filtered portions to determine the presence of harmonics, and compares the harmonics to a predetermined harmonics threshold, wherein the periodicity is detected if the harmonics exceed the predetermined harmonics threshold.

8. A delta-sigma modulator dithering method including a dithering capability for eliminating idle tones, comprising:
  detecting periodicity in a digital signal output of the delta-sigma modulator;
  activating a dithering signal directed onto an input of the delta-sigma modulator during periods when the periodicity is detected;
  generating a substantially random sequence as a dithering sequence; and
  modulating the dithering sequence onto an input of the delta-sigma modulator as a pulse-width modulated (PWM) digital dithering signal, wherein the generating and modulating are activated during periods when the periodicity is detected.

9. The method of claim 8, with detecting the periodicity further comprising comparing a sampling window of the digital signal output to one or more predetermined patterns and the periodicity is detected if the sampling window matches at least one pattern of the one or more predetermined patterns.

10. The method of claim 8, with detecting the periodicity further comprising:
  masking one or more portions of the digital signal output with one or more predetermined masks to generate one or more masked portions; and
  comparing a remaining digital content of the one or more masked portions to a predetermined mask threshold, wherein the periodicity is detected if the remaining digital content exceeds the predetermined mask threshold.

11. The method of claim 8, with detecting the periodicity further comprising:
  filtering one or more portions of the digital signal output to generate one or more filtered portions;
  processing the one or more filtered portions to determine the presence of harmonics; and
  comparing the harmonics to a predetermined harmonics threshold, wherein the periodicity is detected if the harmonics exceed the predetermined harmonics threshold.

12. The method of claim 8, with detecting the periodicity further comprising:
  comb filtering one or more portions of the digital signal output to generate one or more comb filtered portions;
  processing the one or more comb filtered portions to determine the presence of harmonics; and
  comparing the harmonics to a predetermined harmonics threshold, wherein the periodicity is detected if the harmonics exceed the predetermined harmonics threshold.

* * * * *